United States Patent [19]
Klaasen et al.

[11] Patent Number: 5,309,298
[45] Date of Patent: May 3, 1994

[54] SUPPRESSION OF MAGNETIC INSTABILITY IN INDUCTIVE RECORDING HEADS

[75] Inventors: Klaas B. Klaasen; Jacobus C. L. van Peppen, both of San Jose, Calif.

[73] Assignee: International Business Machines Corporation, Armonk, N.Y.

[21] Appl. No.: 980,820

[22] Filed: Nov. 24, 1992

[51] Int. Cl.$^5$ ................. G11B 5/02; G11B 5/035
[52] U.S. Cl. ................................ 360/67; 360/65
[58] Field of Search .............. 360/113, 119, 67, 68, 360/65, 46, 40, 51; 330/104, 112, 291, 293; 369/27 R

[56] References Cited

U.S. PATENT DOCUMENTS

| | | | |
|---|---|---|---|
| 4,159,489 | 6/1979 | Braitberg | 360/65 |
| 4,280,158 | 7/1981 | de Niet | 360/113 |
| 4,470,020 | 9/1984 | Mohr | 360/65 X |
| 4,956,729 | 12/1992 | Yatsugi et al. | 360/65 X |
| 5,168,397 | 12/1992 | Iwamura et al. | 360/67 |

OTHER PUBLICATIONS

*Electronic Design,* Sidney A. Friedman Sep. 27, 1969 "Streamline Feedback-Amplifier Design".

*Primary Examiner*—John Shepperd
*Assistant Examiner*—Thien Minh Le
*Attorney, Agent, or Firm*—Henry E. Otto, Jr.

[57] ABSTRACT

Circuitry for eliminating magnetic instability of an inductive magnetic transducer during sensing of data from a magnetic recording medium to prevent distortion of the readback signal by hysterically moving domain walls. An inductive sensing coil has an impedance constituting the output impedance of the transducer. Means connected to the coil amplifies a data signal generated by the magnetic flux changes and produces a selected input impedance. The sum of these input and output impedances is selected to be small enough to substantially eliminate motion of the domain walls in the yoke of the transducer while the transducer is sensing data from the medium.

13 Claims, 4 Drawing Sheets

SUPPRESSION OF MAGNETIC INSTABILITY IN INDUCTIVE RECORDING HEADS

This invention relates to circuitry for eliminating or substantially reducing magnetic instability in inductive recording heads, and more particularly to circuitry including means for reducing motion of the magnetic domain walls in the yoke region of the head while the head is sensing data on a magnetic recording disk.

BACKGROUND OF THE INVENTION

Inductive magnetic recording heads (ferrite, metal-in-gap ferrite as well as thin-film heads) exhibit magnetic instability resulting from unstable and nonreproducible magnetic domain patterns in the yoke of the head after different write operations. These instabilities become more pronounced as track widths become narrower and the number of coil turns is increased to enhance recording density. One type of magnetic instability is "write instability"; i.e., the nonconstancy of the read response of a head following successive write operations as a result of Barkhausen noise. Another type of magnetic instability is "read instability" which can occur even when a head is not write-exercised for a long time and causes the data readback signal to vary or be distorted as a result of hysteretically moving domain walls. These types of instability can cause the head to respond to prerecorded magnetic transitions by affecting the readback signal in four different ways: (a) varying pulse amplitude, (b) varying pulse shape, (c) generating noise transients on predominantly the trailing edge of the pulse, and (d) generating noise transients randomly in time, predominantly directly after a write operation.

Phenomena (a) and (b) are caused by the domain patterns in predominantly the pole tip and apex regions of a thin-film head and in the crystallites adjacent to the gap and the airbearing surface of a ferrite head. Varying pulse amplitude (a) is due to variation in readback efficiency caused by variations in reluctance of the yoke associated with the different domain patterns following successive write operations. This results in a variation in the efficiency with which data signal flux is collected by the head. Varying pulse shape (b) is caused by the frequency dispersion in the part of the total data flux threading the coil that is contributed by predominantly reversible domain wall motion rather than by magnetization rotation. The different domain patterns occurring after write operations contribute differing fractions to the total flux sensed by the coil, resulting in differing dispersions; i.e., frequency dependencies. Phenomenon (c) results from the irreversible part of the wall motion induced by the data signal, which produces noise transients in head output voltage that are correlated to the readback signal. Finally, effect (d) results from delayed relaxation of the domain pattern in the head yoke after a write operation.

As a result of these phenomena (1) equalization of the channel becomes ambiguous because there is a plurality of pulse shapes to be equalized, rather than a single, isolated pulse shape; (2) the noise transients can create peak shift or extra peaks in a peak-detect channel and cause signal-correlated noise in a partial response maximum likelihood (PRML) channel; (3) specific domain patterns in the yoke of the head may produce enough remanence of the pole tips to partially erase the magnetic data transitions on the recording disk because even a weak field will reduce the magnetic data after many passes; and (4) servo sector information may become erratic (i.e., produce jittery position error signals) when writing data in a disk drive with embedded servo. Magnetic head instability, therefore, limits the use of inductive heads in high linear density applications using narrow track widths, and/or using embedded servo.

U.S. Pat. No. 4,280,158 discloses a magnetoresistive (MR) head comprising an MR sensor connected to an amplifier for suppressing Barkhausen noise by generating a negative feedback magnetic field that produces a magnetic flux in the MR sensor of a polarity opposite that of the field to be detected. The MR sensor is DC-biased, and a DC sense current is needed for readout of the sensor. A separate actuator is required in the form of a coil or "turn" to generate the field. The negative feedback is generated by a loop circuit. The purpose of the MR head is to linearize the resistance of the MR sensor in relation to the magnetic data signal input.

No prior art known to applicants discloses circuitry for eliminating magnetic instability of an inductive magnetic head by inhibiting motion of the domain walls in the yoke of the head during sensing of data so that inductive magnetic heads can be used in applications requiring narrow track widths, high linear densities, and embedded servo.

SUMMARY OF THE INVENTION

Circuitry is disclosed for substantially eliminating magnetic instability of an inductive magnetic transducer during sensing of data from a magnetic recording medium. This objective is achieved by making the impedance of a loop circuit consisting of an inductive sensing coil connected to the input of a modified arm electronics module (data signal preamplifier) as small as possible so essentially no voltage will be induced during reading of data by the transducer. Any voltage will be immediately opposed by a very large current, so no readback signal-induced change in magnetic flux will occur in the yoke of the transducer; the magnetic domain walls in the yoke therefore will not move, and the magnetic domain pattern will remain constant.

More specifically, the circuitry embodying the invention comprises means connected to the inductive sensing coil for amplifying a data signal generated by magnetic flux changes and producing a selected input impedance. The impedance of the coil constitutes the output impedance of the transducer. The sum of these input and output impedances is selected to be small enough to substantially eliminate motion of the domain walls in the yoke of the transducer while the transducer is sensing data from the recording medium.

The selected input impedance may be substantially zero, effectively short circuiting the coil, or substantially equal to but of opposite polarity from the output impedance, effectively making the impedance of the loop circuit zero. This may be achieved with a voltage amplifier having inputs connected to the coil and either shunting the amplifier with an impedance means or providing a transconductance amplifier in the feedback path of the amplifier to provide negative feedback for reducing the input impedance substantially to zero or positive feedback for reducing the loop circuit impedance substantially to zero.

DESCRIPTION OF PREFERRED EMBODIMENTS

Figure 1:
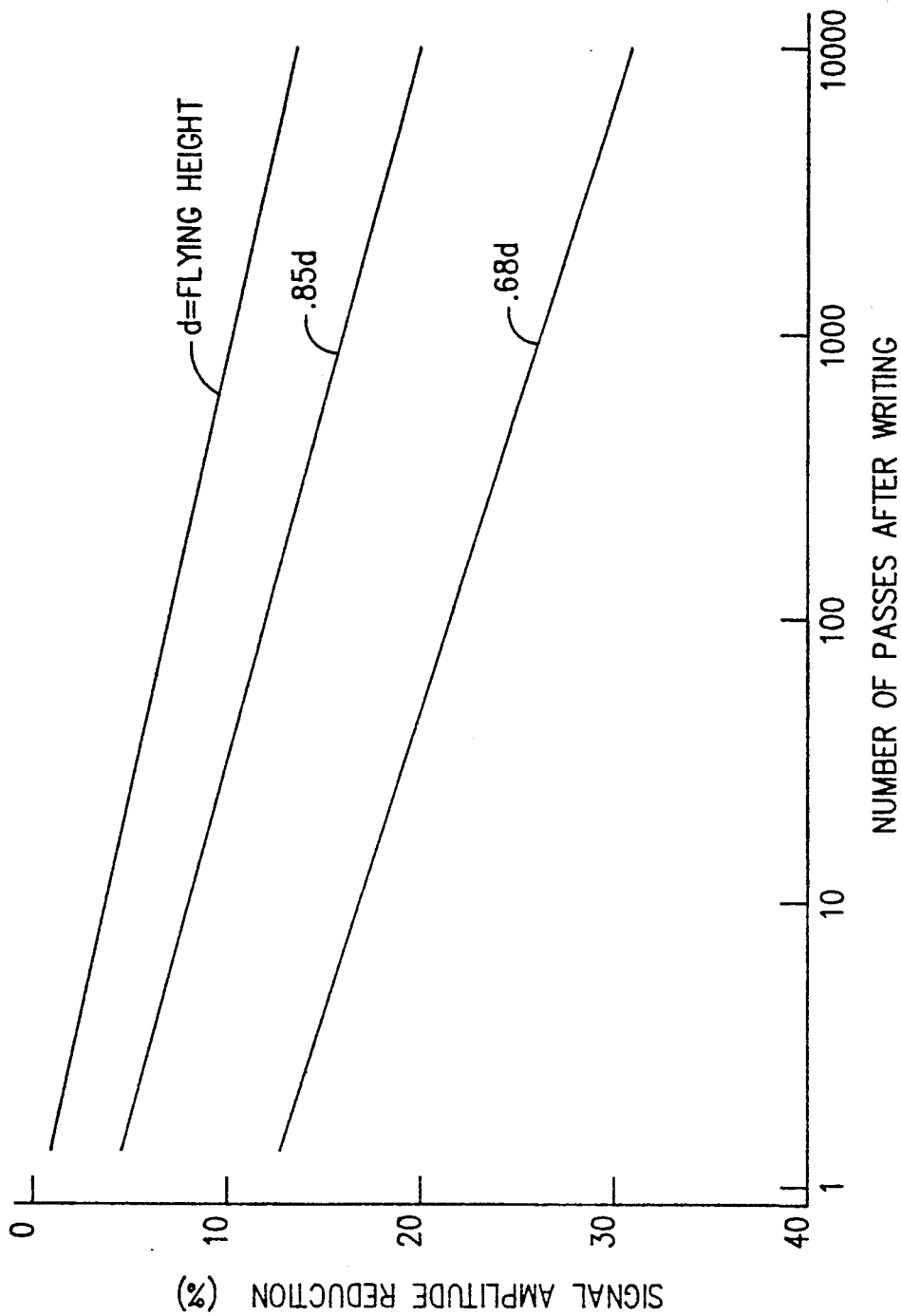
FIG. 1 is a plot of percentage reduction in signal amplitude vs. the number of passes after writing of data at various flying heights of a remanent inductive magnetic transducer over the air bearing surface of the magnetic recording medium.

FIG. 1 illustrates how nonrelaxing domain walls in the yoke region of an inductive magnetic transducer can cause a magnetic remanence large enough to progressively reduce the amplitude of a readback signal and thereby progressively partially erase the data recorded on a magnetic recording medium as the number of passes following a write operation increases. FIG. 1 also shows that the rate of deterioration in readback signal amplitude increases as the flying height of the transducer over the recording medium decreases.

Figure 2:
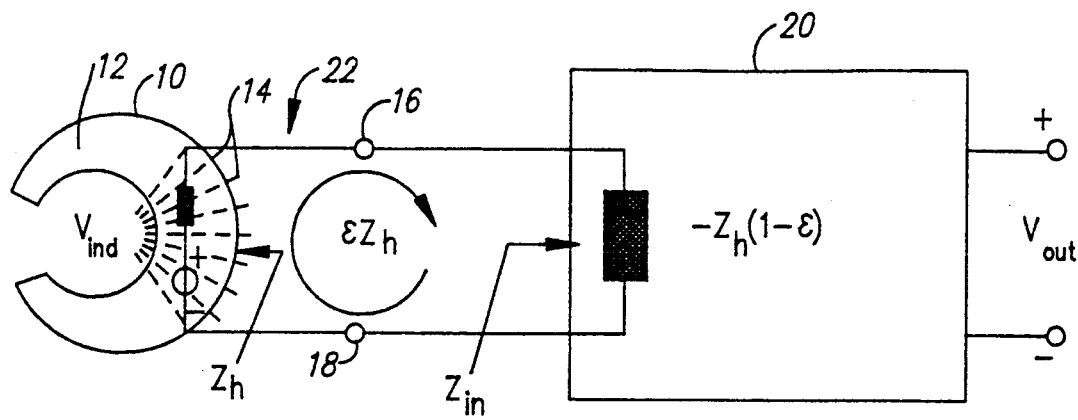
FIG. 2 is a schematic diagram of circuitry generically embodying the invention and showing that the generic principle of the invention involves providing a loop circuit with a low impedance $\epsilon Z_h$.

FIG. 2 depicts an inductive magnetic recording transducer or head 10 comprising a yoke 12 having magnetic domain walls and an inductive sensing coil 14 wrapped around the yoke for sensing data on a magnetic recording medium (not shown) and generating a data signal in response to magnetic flux changes. Coil 14 has an impedance $Z_h$ which constitutes the output impedance of head 10.

According to the invention, a circuit 20 constituting a modified arm-electronics module is connected to the output terminals 16, 18 of the head. Circuit 20 amplifies the induced voltage signal $V_{ind}$ by providing a voltage gain $G = V_{out}/V_{ind}$, and it also produces a low input impedance $Z_{in}$.

According to a feature of the invention, coil 14 in combination with circuit 20 forms a loop circuit 22 having a low total loop impedance $\epsilon Z_h$ where $\epsilon$ has a value between $-1$ and $+1$. This impedance $\epsilon Z_h$ is the sum of the input impedance $Z_{in}$ and output impedance $Z_h$. This sum is selected to have a magnitude small enough to inhibit data signal flux variations in yoke 12 for substantially eliminating (i.e., freezing) motion of the domain walls of the yoke while head 10 is sensing data.

More specifically, this low loop impedance $\epsilon Z_h$ is designed to inhibit flux variations in the data signal at low frequencies (i.e., below the range of about 0.5–2.5 MHz) at which motion of the domain walls of the yoke can occur.

FIG. 2 constitutes a schematic diagram generically depicting circuitry for achieving the above-stated objectives of the invention. Various specific embodiments for implementing the invention will now be described.

Figure 3:
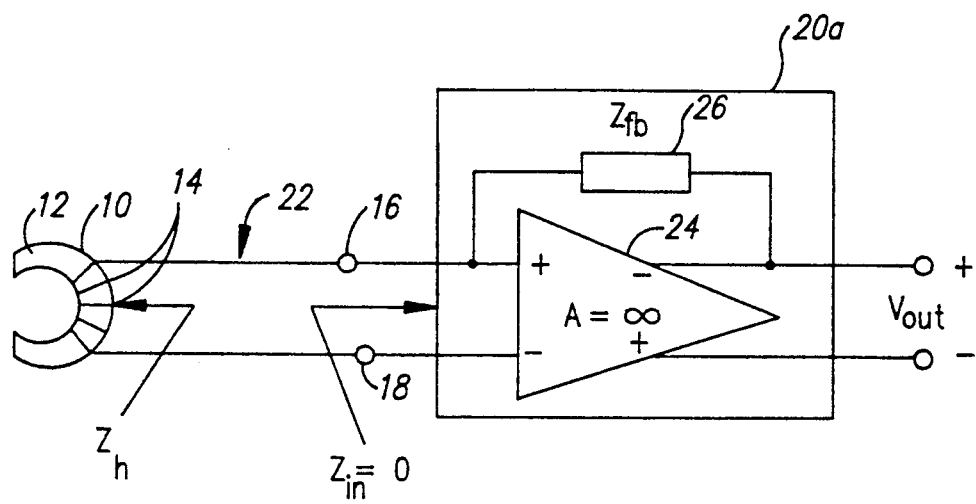
FIGS. 3 and 4 are schematic diagrams of circuitry constituting different implementations of the invention of FIG. 2, each comprising negative feedback applied across an operational voltage amplifier to an essentially zero input impedance.

As illustrated in FIG. 3, circuit 20a includes an operational voltage amplifier 24 with its inputs connected to terminals 16, 18. Means 26 produces an impedance $Z_{fb}$ which shunts amplifier 24 and provides a negative feedback path across the amplifier for short circuiting coil 14. This creates an input impedance $Z_{in}=0$ (i.e., $\epsilon=1$), and provides a data signal voltage gain $G = V_{out}/V_{ind} = -Z_{fb}/Z_h$.

Figure 4:
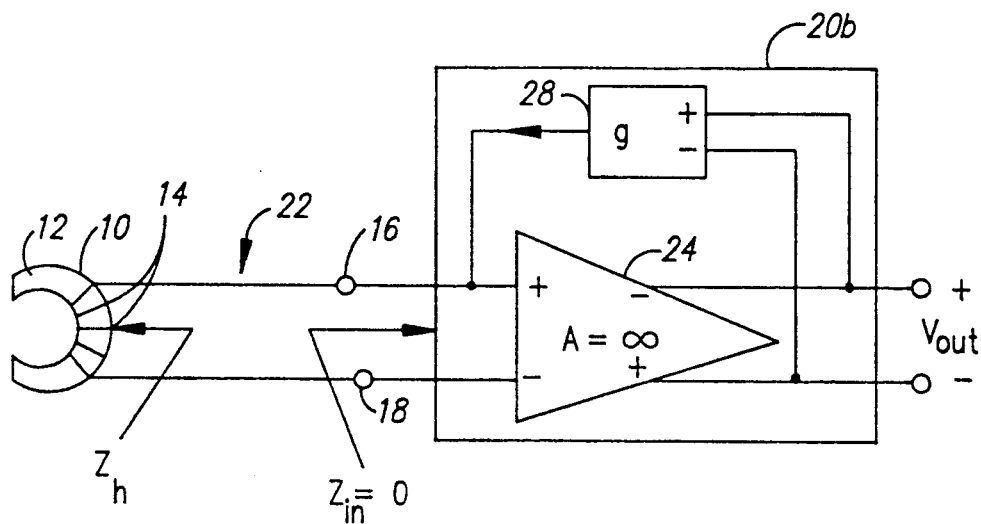

In the modified implementation shown in FIG. 4, circuit 20b includes the amplifier 24 but means 26 is replaced by a transconductance amplifier 28 that is connected in a feedback path from amplifier 24, creating negative feedback which nulls the input impedance $Z_{in}$ and short circuits coil 14. This creates an input impedance $Z_{in}=0$ (i.e., $\epsilon=1$), and produces a data signal voltage gain $G = V_{out}/V_{ind} = -1/gZ_h$, where g is the transconductance of amplifier 28.

Figure 5:
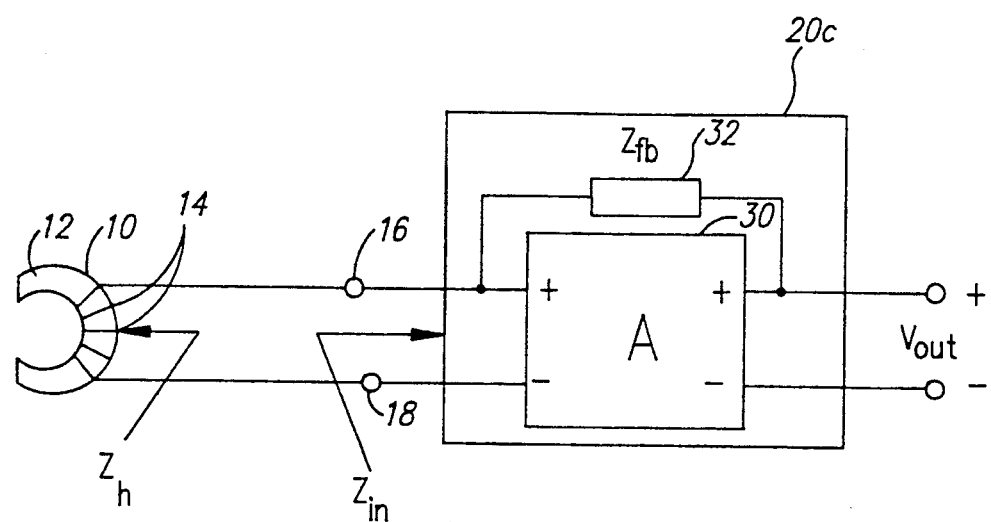
FIGS. 5 and 6 are schematic diagrams of circuitry constituting other, different implementations of the invention of FIG. 2, each comprising positive feedback applied across a voltage amplifier to create a selected negative input impedance.

As illustrated in FIG. 5 circuit 20c includes a voltage amplifier 30 with its inputs connected to terminals 16, 18. Means 32 shunts amplifier 30 and provides an impedance $Z_{fb}$ in a positive feedback path that modifies the input impedance $Z_{in}$ to render it substantially equal to, but of a polarity opposite that of, output impedance $Z_h$. The input impedance $Z_{in} = -Z_h(1-\epsilon)$, where $\epsilon$ has a value between $-1$ and $+1$, and feedback impedance $Z_{fb} = Z_h(1-\epsilon)(A-1)$, A being the gain of voltage amplifier 30. This reduces the impedance $\epsilon Z_h$ of the loop circuit below that achieved in FIGS. 3 or 4. The data signal gain $V_{out}/V_{ind} = A(\epsilon-1)/\epsilon$, and $\epsilon$ has a value preferably close to $\epsilon=0$.

Figure 6:
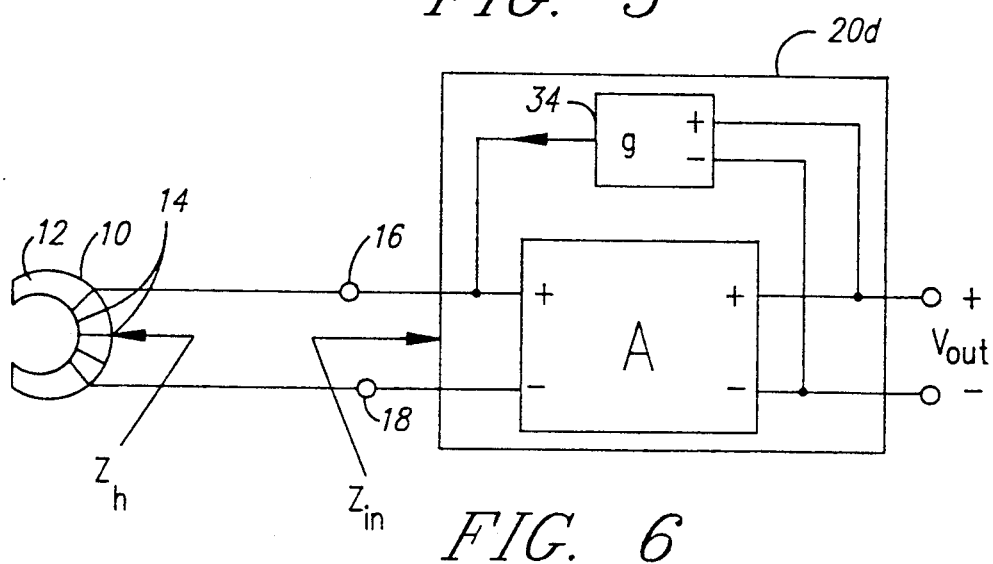

In the modified implementation depicted in FIG. 6, circuit 20d includes the amplifier 30, but means 32 is replaced by a transconductance amplifier 34 interposed in the feedback path from voltage amplifier 30. Amplifier 34 provides positive feedback for modifying input impedance $Z_{in}$ to make it equal to, but of a polarity opposite that of, output impedance $Z_h$. Then input impedance $Z_{in} = -Z_h(1-\epsilon)$, where $\epsilon$ has a value between $-1$ and $+1$, if the transconductance of amplifier 34 is selected such that gain $g = 1/AZ_h(1-\epsilon)$, where A is the gain of the forward path of voltage amplifier 30. The data signal gain $G = V_{out}/V_{ind} = A(\epsilon-1)/\epsilon$. Again, $\epsilon$ has a value preferably close to $\epsilon=0$.

Figure 7:
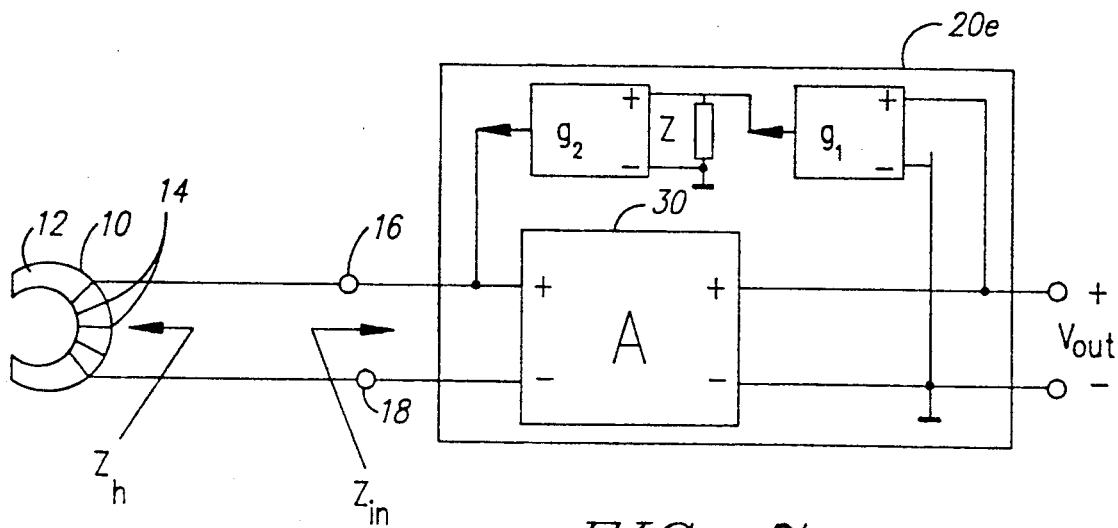
FIG. 7 is a schematic diagram of a preferred embodiment of the circuitry illustrated in FIG. 6.

FIG. 7 illustrates a preferred embodiment of the implementation shown in FIG. 6. In this preferred embodiment, input impedance $Z_{in} = -Z_h(1-\epsilon)$ and $\epsilon$ has a value between $-1$ and $+1$, as in FIG. 6; but amplifier 34 is replaced by two transconductance amplifiers $g_1, g_2$ circuited in cascade with an impedance Z inserted to give a transconductance gain $g = g_1 g_2 Z$ with the required frequency dependency. Z is chosen so that $Z = 1/g_1 g_2 AZ_h(1-\epsilon)$. As in FIG. 6, the data signal voltage $G = V_{out}/V_{ind} = A(\epsilon-1)/\epsilon$, with $\epsilon$ having a value as close as possible to $\epsilon=0$, preferably 0.1 to 0.05. Note that since output impedance $Z_h$ appears in the denominator, impedance Z can desirably be provided by a resistor in parallel with a capacitor. By contrast, if $Z_h$ were in the numerator, impedance Z would have to be provided by a resistor in series with an inductor, and inductors have more parasitic properties, larger tolerances, provide more electro-magnetic interference, and cost more than capacitors.

Figure 8:
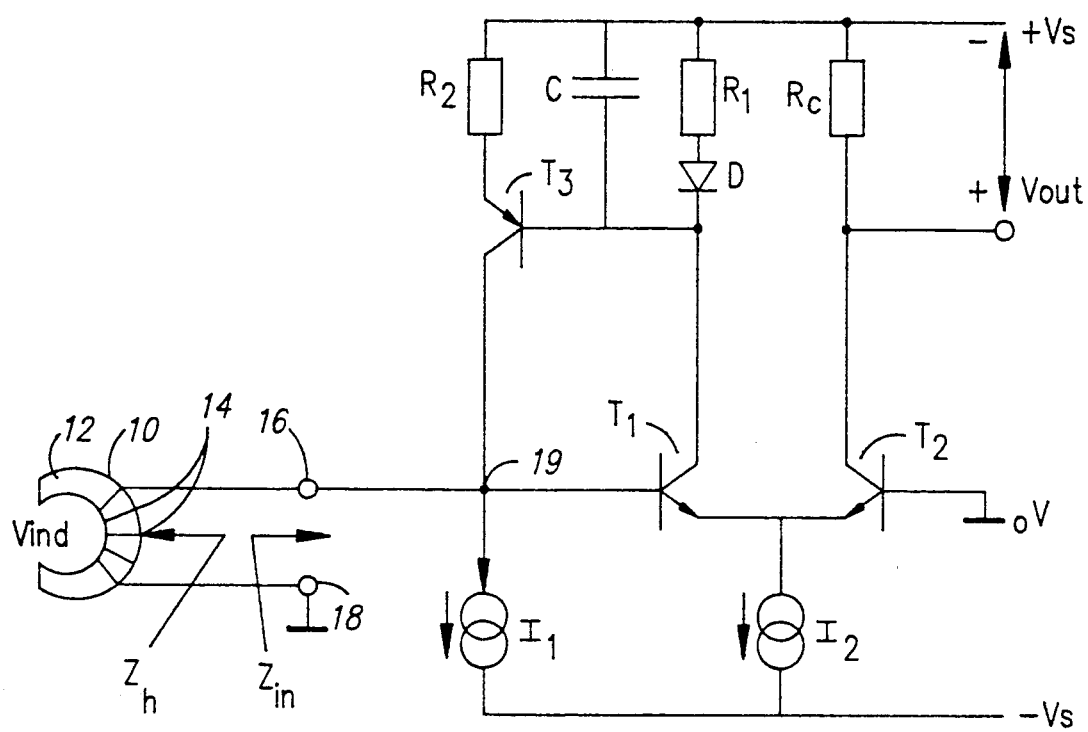
FIG. 8 is a detailed schematic diagram of circuitry for implementing the preferred embodiment illustrated in FIG. 7.

FIG. 8 shows a preferred embodiment of the modified arm-electronics module 20e shown schematically in FIG. 7. As illustrated in FIG. 8, module 20e comprises an amplifier consisting of transistors $T_1$ and $T_2$ connected as a pair and with tail current $I_2$ for amplifying the head voltage $V_{ind}$. Head terminal 16 is connected to the base of transistor $T_1$ and head terminal 18 is grounded. The base of transistor $T_2$ is grounded. This amplifier constitutes the transconductance amplifier $g_1$ of FIG. 7, where the base of transistor $T_1$ is the input terminal and the collector of transistor $T_1$ is the output terminal. Amplifier A is degenerated in this embodiment to a simple connection between node 19 and the base of transistor $T_1(A=1)$ whose output is available at the collector of transistor $T_2$ after amplification. The collector of transistor $T_2$ is connected via a resistor Rc to positive power supply line $+V_s$. The voltage across resistor Rc is the data signal output voltage $V_{out}$ which constitutes the induced readback signal. Between the collector of transistor $T_1$ and positive power supply $+V_s$ a network is connected comprising a resistor $R_1$ and a diode D in series with a capacitor C in parallel. This network constitutes the impedance Z in FIG. 7. The voltage across this network is the input voltage of the second transconductance amplifier ($g_2$ in FIG. 7) in the feedback path. This transconductance amplifier $g_2$ comprises PNP transistor $T_3$ whose base is the input terminal of the transconductance amplifier $g_2$ and is connected via a resistor $R_2$ to power supply $+V_s$. The collector of transistor $T_3$ is the output terminal of the transconductance amplifier and is connected to head terminal 16. A bleed-off current source $I_1$ is provided to avoid dc current through the head. The current $I_1$ should be substantially equal to the dc output current of the transconductance amplifier. With $R_2 = R_1$, current $I_1$ should be equal to the collector current of transistor $T_1$. With no dc current flowing through the head, the dc voltage at the base of transistor $T_1$ is zero. As a result, the collector currents of transistors $T_1$ and $T_2$ are equal and each is consequently equal to $I_2/2$. Hence, current $I_1$ should be substantially equal to $I_2/2$.

The impedance of the network in the collector of transistor T1 is $$Z_c 1 = \frac{R_1 + r_e}{sC(R_1 + r_e) + 1},$$

where s is the Laplace variable, $r_e = 2kT/qI_2$, with T the absolute temperature, k Boltzmann's constant, and q the electron charge.

The head impedance $$Z_h = sL_h + R_h = R_h \left( s\frac{L_h}{R_h} + 1 \right),$$

where $L_h$ is the inductance of the head and $R_h$ is the resistance of the head.

The time constant $C(R_1 + r_e)$ should be chosen to be equal to the head time constant $\tau_h$, where $\tau_h = L_h/R_h$.

With the above assumptions, the input impedance $Z_{in}$ becomes $Z_{in} = -2r_e(s\tau_h + 1)$; and the output voltage $V_{out}$ becomes $$V_{out} = \frac{R_c}{2r_e - R_h} V_{ind}.$$

where $V_{ind}$ is the induced head voltage if the head terminals 16, 18 were left unconnected. With $2r_e = R_h(1-\epsilon)$, the input impedance $Z_{in}$ becomes $-Z_h(1-\epsilon)$ and the output voltage $$V_{out} = \frac{R_c}{2r_e} \frac{(\epsilon - 1)}{\epsilon} = -\frac{R_c}{\epsilon R_h} V_{ind}.$$

While the invention has been particularly shown and described with reference to various embodiments thereof, it will be understood by those skilled in the art that changes in form and detail may be made therein without departing from the spirit and scope of the invention. Accordingly, the embodiments herein disclosed are to be considered as merely as illustrative and the invention is to be limited only as specified in the claims.

We claim:

1. For use with a magnetic recording medium, circuitry comprising:
    an inductive magnetic transducer (10) having (i) a yoke region (12) with magnetic domain walls separating differently oriented magnetic domains and (ii) and inductive sensing coil (14) for sensing data on the recording medium and generating a data signal produced by magnetic flux changes, said coil having an impedance constituting the output impedance ($Z_h$) of the transducer; and
    means (22) connected to the coil for amplifying the data signal and having as an input an electronics input impedance ($Z_{in}$), where $Z_{in} = -Z_h(1-\epsilon)$ and $\epsilon$ has a value between $+1$ and $-1$, the vectorial sum of said input and output impedances having a magnitude that (i) inhibits motion of the domain walls in the yoke region, while the transducer is sensing data, and (ii) inhibits flux variations of the data signal at frequencies at which motion of the domain walls can occur.

2. The circuitry of claim 1, wherein the value of $\epsilon$ is $+1$ and the input impedance is zero to short circuit the coil for preventing motion of the domain walls.

3. The circuitry of claim 1, wherein $\epsilon$ is substantially zero and the input impedance therefore is substantially equal to the output impedance, but of a polarity opposite that of the output impedance, thereby to substantially eliminate motion of the domain walls while the transducer is sensing data.

4. The circuitry of claim 1, wherein said means includes
    a voltage amplifier (24) whose inputs are connected to the coil; and
    means (26) shunting the amplifier and providing a negative feedback path across the amplifier for reducing the input impedance substantially to zero.

5. The circuitry of claim 1, wherein said means includes
    a voltage amplifier (24) whose inputs are connected to the coil; and
    a transconductance amplifier (28) in a feedback path from the voltage amplifier providing a negative feedback for reducing the input impedance substantially to zero.

6. The circuitry of claim 1, wherein said means includes
    a voltage amplifier (30) whose inputs are connected to the coil; and
    means (32) shunting the amplifier and providing an impedance ($Z_{fb}$) in a positive feedback path that modifies the input impedance ($Z_{in}$) to become substantially equal to, but of a polarity opposite that of, the output impedance ($Z_h$).

7. The circuitry of claim 6, wherein the impedance $Z_{fh}=Z_h(1-\epsilon)(A-1)$, A being the voltage amplifier gain.

8. The circuitry of claim 1, wherein said means includes
- a voltage amplifier (30) whose inputs are connected to the coil; and
- a transconductance amplifier (34) in a feedback path from the voltage amplifier that provides positive feedback for modifying the input impedance ($Z_{in}$) to become equal to, but of a polarity opposite that of, the output impedance ($Z_h$).

9. The circuitry of claim 8, where the transconductance amplifier (34) has a gain $g=1/AZ_h(1-\epsilon)$, A being the amplification of the voltage amplifier.

10. The circuitry of claim 8, where the transconductance amplifier (34) consists of two transconductance amplifiers ($g_1,g_2$) circuited in cascade with an impedance Z to give a transconductance gain $g=g_1g_2Z$, where $Z=1/g_1g_2AZ_h(1-\epsilon)$, A being the amplification of the voltage amplifier.

11. A method of inhibiting motion of the magnetic domain walls of the yoke region of an inductive magnetic transducer that includes an inductive sensing coil that senses data on a magnetic recording medium, generates a data signal from magnetic flux changes, and has an impedance constituting the output impedance ($Z_h$) of the transducer, comprising the steps of:
- amplifying the data signal with a circuit including an amplifier connected to the coil and having as an input a selectable electronics input impedance ($Z_{in}$); and
- selecting input and output impedances such that $Z_{in}=-Z_h(1-\epsilon)$, where $\epsilon$ has a value between $+1$ and $-1$ and the vectorial sum of said impedances has a magnitude that (i) inhibits said motion of the domain walls in the yoke region, while the transducer is sensing data, and (ii) inhibits flux variations of the data signal at frequencies at which motion of the domain walls can occur.

12. The method claim 11, including during the selecting step, selecting zero as the magnitude of the input impedance for short circuiting the coil.

13. The method of claim 11, including during the selecting step, selecting substantially zero as the value of $\epsilon$ for causing the magnitude of the input impedance to be substantially equal to, but of a polarity opposite that of, the output impedance.

* * * * *